United States Patent [19]

Werner

[11] 4,410,861
[45] Oct. 18, 1983

[54] OUT OF LOCK DETECTOR FOR A SAMPLE AND HOLD PHASE LOCK LOOP

[75] Inventor: Gerald C. Werner, Newport Beach, Calif.

[73] Assignee: Motorola, Inc., Del.

[21] Appl. No.: 447,837

[22] Filed: Dec. 8, 1982

Related U.S. Application Data

[63] Continuation of Ser. No. 126,622, Mar. 3, 1980, abandoned.

[51] Int. Cl.³ .............................................. H03L 7/06
[52] U.S. Cl. ................................. 331/25; 331/DIG. 2; 331/74
[58] Field of Search ................ 331/DIG. 2, 1 A, 1 R, 331/17, 25, 74; 307/511, 514, 516; 328/133, 134; 324/83 A, 83 D

[56] References Cited

U.S. PATENT DOCUMENTS

| | | | |
|---|---|---|---|
| 3,080,533 | 3/1963 | Edwards | 331/DIG. 2 X |
| 3,893,042 | 7/1975 | Whitman et al. | 328/133 X |
| 3,922,602 | 11/1975 | Lunquist | 328/133 X |
| 3,932,821 | 1/1976 | McClaskey | 331/25 |
| 3,956,710 | 5/1976 | Seitz et al. | 331/17 X |
| 4,034,310 | 7/1977 | Coe | 331/1 A X |
| 4,039,966 | 8/1977 | Skinner | 331/17 X |
| 4,131,862 | 12/1978 | Black et al. | 331/25 X |

*Primary Examiner*—Siegfried H. Grimm
*Assistant Examiner*—Edward P. Westin
*Attorney, Agent, or Firm*—James W. Gillman; James A. Scheer

[57] ABSTRACT

An out of lock detector for a sample and hold phase locked loop which provides very accurate resolution and can detect that the loop is converging while in the linear range of the phase detector. The circuit is composed of an AC coupled amplifier which receives signals from the phase locked loop sample and hold phase detector and provides a signal to a comparator network. The comparator network is comprised of two amplifiers whose outputs are in a wired AND configuration. The comparator amplifiers are referenced for the degree of lock required such that a voltage from the input amplifier which exceeds either the upper or lower reference voltage will produce a negative going pulse at the wired AND output circuit indicative of an out of lock condition.

5 Claims, 3 Drawing Figures

OUT OF LOCK DETECTOR INPUT

OUT OF LOCK DETECTOR FOR A SAMPLE AND HOLD PHASE LOCK LOOP

This is a continuation, of application Ser. No. 126,622, filed Mar. 3, 1980, now abandoned.

BACKGROUND OF THE INVENTION

A. Field of the Invention

The present invention relates generally to sample and hold phase locked loops and more particularly to an improved detector for indicating when the phase locked loop is out of the lock condition.

B. Description of the Prior Art

Phase locked loops are widely used in electronics communication systems for such application as frequency synthesis. A typical sample and hold phase locked loop suitable for frequency synthesis essentially consists of: a sample and hold phase detector for a divided voltage controlled oscillator signal, a low pass filter for receiving the output of the phase comparator, a VCO for receiving the output of the low pass filter, and a loop divider for dividing the VCO output and applying the divided signal to the phase comparator.

Basically, the phase comparator forms a difference signal by comparing the external reference signal and the divided VCO signal (loop pulse). The difference signal is passed through a low pass filter to obtain a DC control voltage (steering voltage) which controls the frequency of the VCO. When the frequency of the external reference signal and the frequency of the divided voltage controlled oscillator signal are substantially identical, the phase locked loop is said to be in the state of lock. Conversely when the external reference signal and the divided VCO signal differ in frequency by more than a predetermined amount or portion, the phase locked loop is said to be out of lock.

It is useful to determine when the phase locked look is in an out of lock condition to allow certain loop parameters to be changed so that the loop can acquire lock over a wider frequency range, or to prevent some function from operating until the loop has achieved the proper locked condition. A common problem with prior art out of lock detectors for sample and hold phase locked loops is that they cannot detect that the loop is still converging to the correct frequency while it is in the linear range of the phase detector.

One prior art out of lock detector for this type of phase locked loop is the frequency steering out of lock detector. This out of lock detection scheme basically consists of two digital phase detectors connected with other logic so as to compare the relative phases of the reference signal and the divided loop pulse. The frequency steering logic defines in lock as a condition where the the loop pulse rises anywhere in the 0° to 180° region of the reference signal. The out of lock command is generated whenever the loop pulse rises prior to the reference or when the reference falls before the loop pulse rises. This approach is relatively slow at detecting the out of lock condition especially in the situation in which the VCO frequency is too low, and is unable to detect a condition in which there is excessive reference feed through. A far more serious limitation of this method is that it cannot detect the condition in which the phase detector is in the linear range but the VCO is not at the exact required frequency.

Another type of prior art out of lock detection is the rail detection method. This type of out of lock detection is based simply on the fact that if, for example, three to eight volts DC is the useful steering voltage range of the synthesizer, any phase detector voltage higher or lower than these limits is unacceptable or out of lock. The rail detector can be built by using two comparators to compare the phase detector voltage to a high and low preset reference. With this technique an out of lock indication may not be generated if the synthesizer system is close to the desired frequency (i.e., in the linear range), or is beating at a very low frequency. Also, if the loop pulse is lost due to a malfunction, it would take a long time for an out of lock indication to be generated.

SUMMARY OF THE INVENTION

An object of this invention is to provide an improved out of lock detector for use with a sample and hold phase locked loop.

Another object of this invention is to provide an improved out of lock detector for use with a sample and hold phase locked loop which can detect that the loop is converging while within the linear phase detector range.

Another object of this invention is to provide an improved out of lock detector for use with a sample and hold phase locked loop which can detect excessive reference feedthrough conditions.

Briefly, in accordance with one embodiment of the invention, there is provided an improved out of lock detector for use with a sample and hold phase lock loop. In the out of lock detector the output of the phase detector of a sample and hold phase lock loop is coupled to the amplifier means utilizing AC coupling means. The AC coupled signal is amplified and the resulting pulses are applied to the input of a comparator. The comparator compares the applied signal to predetermined limits and generates an out of lock output signal when the limits are exceeded.

DESCRIPTION OF THE DRAWINGS

For a more complete understanding of the invention reference should be made to the following drawings.

DETAILED DESCRIPTION OF THE INVENTION

The present invention is based on the principle that when the phase detector output is changing the loop is not in lock. If the synthesizer is switching from one frequency to another, the phase detector successively steps to a new DC output voltage as it converges to the new frequency. In the invention these steps are AC coupled and then amplified so as to be compared in value to preset limits. If the step size exceeds what has been determined to be acceptable, an out of lock signal is generated.

Figure 1:
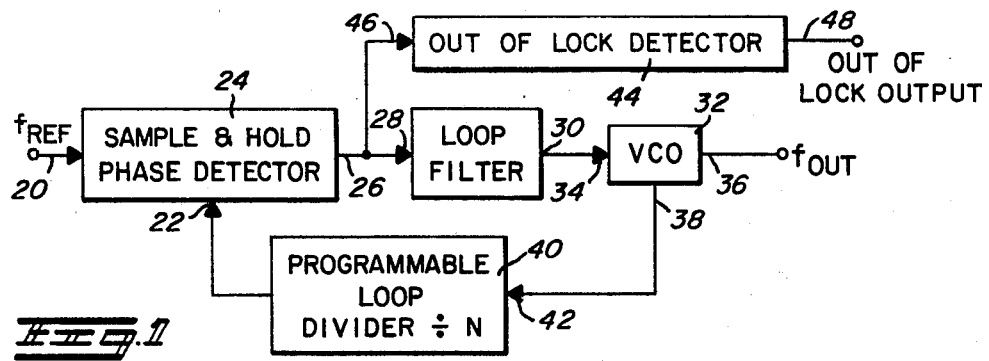
FIG. 1 is a block diagram of an improved sample and hold phase locked loop circuit constructed in accordance with the present invention.

FIG. 1 illustrates a sample and hold phase lock loop which has been constructed in accordance with the present invention. The sample and hold phase detector 24 generates a DC output voltage at its output line 26. The voltage is dependent upon the phase relationship between the reference input signal applied at the phase detector reference input 20, and the loop pulse applied at the phase detector loop input 22. The DC output voltage of the sample and hold phase detector 24 is applied to the input 28 of the loop filter. The form of a typical phase detector output is illustrated as waveform A of FIG. 3. The loop filter filters this waveform to provide a DC voltage at its output 30 which is applied to the VCO 32 at its input 34. The DC voltage applied at the VCO input 34 controls the frequency of the signal which appears at the VCO outputs 36 and 38. The output signal of the VCO at output 38 is applied to the programmable loop divider 40 at its input 42. The output of the programmable loop divider is a loop pulse with a frequency equal to the VCO output frequency divided by N. This signal is applied to the sample and hold phase detector loop input 22. The output of the sample and hold phase detector 24 on the output line 26 is also applied to the out of lock detector 44 at its input 46.

Figure 3:
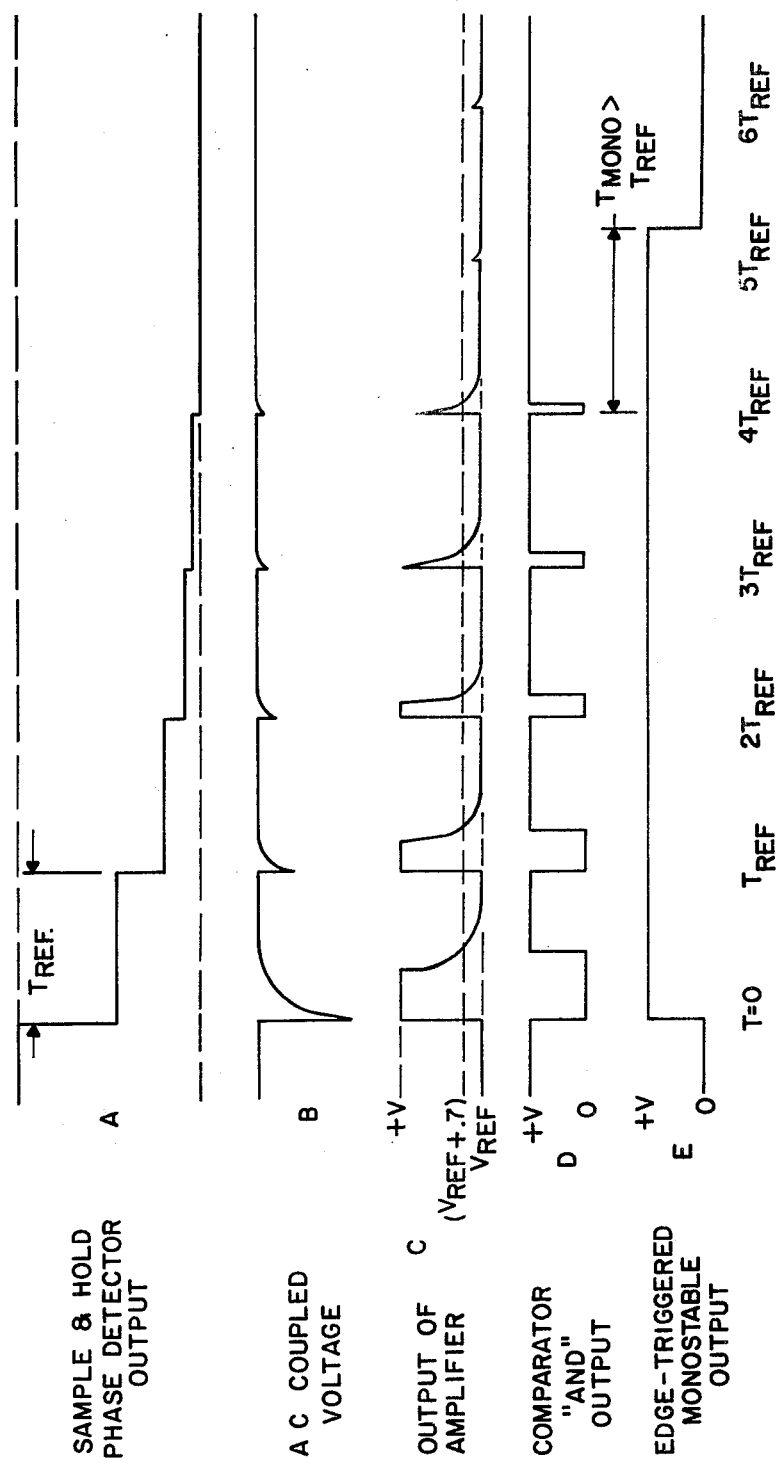
FIG. 3 is a series of graphs illustrating the voltage waveforms present at various locations in the circuit diagram of FIG. 2.

When switching the phase locked loop synthesizer of FIG. 1 from one output frequency to another, the divide ratio N of the loop divider 40 changes. This in turn changes the phase detector 24 output level on the output line 26. In the sample and hold system, at each sample time, the phase detector output voltage makes a step change if the system has not converged to the proper output frequency. The magnitude of this step change decreases as the control system approaches the locked condition. Waveform A of FIG. 3 represents a typical sample and hold phase detector output for a system which is converging to a new output frequency. This signal is applied to the out of lock detector input 46.

Figure 2:
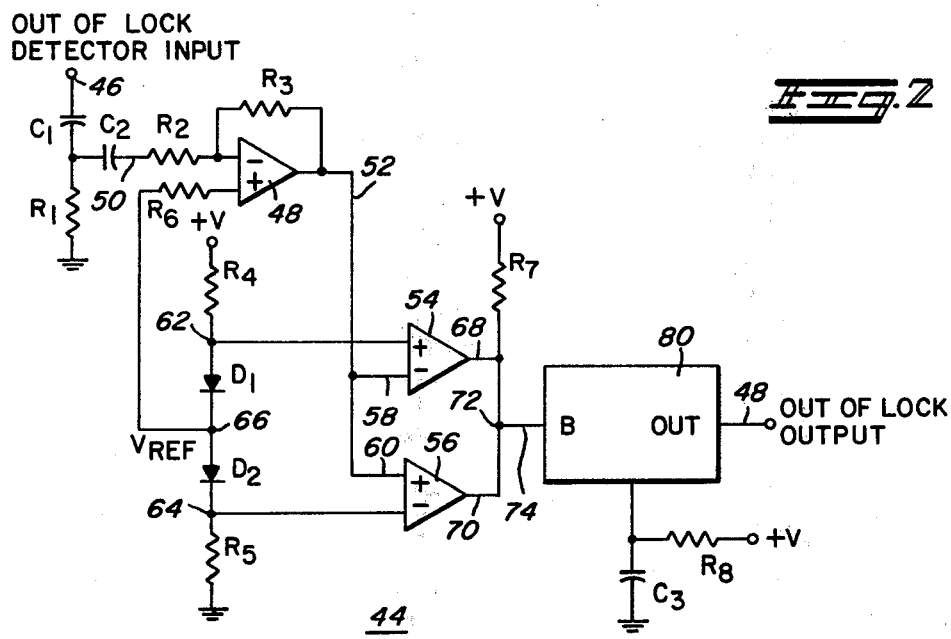
FIG. 2 is a circuit diagram illustrating in more detail the out of lock detector of FIG. 1.

FIG. 2 shows a detailed schematic diagram of a preferred embodiment of the inventive out of lock detector 44. The output of the sample and hold phase detector on the output line 26 is applied to input 46 of the out of lock detector. This signal is AC coupled through the RC network composed of capacitor C1 and C2 and resistor R1 to the amplifier input 50. This AC coupled signal is a differentiated signal representative of the rate of change of the phase detector output. The resulting waveform at the input 50 will therefore be a series of pulses substantially as shown as waveform B in FIG. 3. This signal is amplified by amplifier 48 and applied at its output to line 52. The amplifier 48 also includes the feedback network composed of resistors R2 and R3 as shown. The gain of amplifier 48 is determined by the ratio of resistors R2 and R3. If desired, more than one amplifier may be used at this point to obtain additional gain. The output of the amplifier 48 on line 52 will appear substantially as shown as waveform C of FIG. 3. The sensitivity of the detector is largely determined by the gain of the amplifier 48. Thus, the sensitivity is controllable by the choice of resistors R2 and R3.

The output of amplifier 48 on line 52 is applied to the inverted input 58 of the first comparator 54 and to the non-inverted input 60 of the second comparator 56. At each comparator the signal is compared to a predetermined threshold voltage generated by the voltage divider network composed of resistors R4 and R5 and diodes D1 and D2. The voltage divider generates at point 62 a high threshold voltage which is 0.7 volt above the $V_{REF}$ at the center point 66 due to forward biased diode D1. This voltage is applied directly to the non-inverting input of comparator 54. A low threshold voltage is generated at point 64 which is 0.7 volt below the $V_{REF}$ at the center point 66 due to forward biased diode D2. This voltage is applied to the inverting input of the second comparator 56. In addition, the voltage Vref generated at the center point 66 is applied to the non-inverting input of amplifier 48. This establishes a "no signal" output voltage from the amplifier 48 equal to $V_{ref}$.

When the output voltage of the amplifier 48 on line 52 exceeds the high threshold voltage from point 62, the output 68 of the first comparator 54 will go low indicating an excessive step change indicative of an out of lock condition. Also, when the output voltage of the amplifier 48 on line 52 is less than the low reference voltage generated at point 64, the output 70 of the second comparator 56 will go low again indicating an out of lock condition.

The comparator outputs 68 and 70 (open collectors) are hard wired together to form a logical AND function. Therefore, a set of positive (or negative) going pulses on line 52 such as that shown as waveform C of FIG. 3 will result in a set of negative going pulses at node 72 such as those shown as waveform D of FIG. 3. These pulses at node 72 are indicative of an out of lock condition.

In order to establish a continuous out of lock indication, the signal at node 72 can be coupled to a holding device such as a retriggerable monostable multivibrator. As shown in FIG. 2, the signal at node 72 is coupled to the input 74 of a retriggerable monostable multivibrator 80. The duration of the output pulse of the monostable would be predetermined to be greater than the sample period of the sample and hold phase detector. This time period is established by the values of the external timing components R8 and C3. The result would be a signal on the output 48 which would be a continuous DC signal as long as pulses are continuing to be generated at node 72. Therefore, a continuous out of lock signal is provided. Further, since the pulses are continually generated while the loop is still converging, the invention can detect that the loop is converging even within the linear range of the phase detector. It is therefore apparent that there has been provided, according to the invention, an improved out of lock detector which fully satisfies the objects of the invention.

While a preferred embodiment of the invention has been described and shown, it should be understood that other variations and modifications may be implemented. It is therefore contemplated to cover by the present application any and all other embodiments and variations that fall within the true spirit and scope of the basic underlying principles disclosed and claimed herein.

What is claimed is:

1. An improved out of lock detector for use in a phase lock loop having a sample and hold phase detector which generates a step change in output voltage level in response to a detected phase difference, said out of lock detector comprising:
   (a) amplifier means, having an input and an output, for amplifying signals coupled to the input;
   (b) coupling means, having an input connected to the phase detector, for coupling to the amplifier means a differentiated signal representative of the rate of change of the output voltage level of the phase detector;
   (c) comparator means coupled to the amplifier means output for comparing the signal amplified by the amplifier means to predetermined upper and lower limits and generating an out of lock signal when the amplified signals exceed the predetermined limits.

2. The improved out of lock detector of claim 1 wherein the coupling means is a capacitive AC coupling network.

3. An out of lock detector, for a phase lock loop, having a sample and hold phase detector which generates an output signal representative of detected phase differences, said out of lock detector comprising:
   (a) amplifier means, having a first and second input and an output, for amplifying signals applied to the first input;
   (b) AC coupling means, having an input connected to the phase detector and an output coupled to the first input of the amplifier means, for AC coupling a differentiated output signal of the phase detector to the first input of the amplifier means;
   (c) comparator means, coupled to the amplifier means output, for comparing the signal amplified by the amplifier means to predetermined upper and lower limits and generating an out of lock signal when the amplified signals exceed the predetermined limits;
   (d) voltage generating means, for generating an upper voltage level coupled to the comparator means and a lower voltage level coupled to the comparator means to establish the predetermined comparator limits and an intermediate voltage between the upper and lower voltage levels, coupled to the second input of the amplifier means to provide a predetermined reference voltage level on the output of the amplifier means.

4. The out of lock detector of claim 3 further comprising:
   means, coupled to the comparator means, for maintaining a continuous out of lock signal in response to the out of lock signal generated by the comparator means.

5. A method of detecting an out of lock condition in a phase locked loop having a phase detector which generates a step change in output level in response to a detected phase difference the method comprising the steps of:
   converting the step change output of the phase detector to a differentiated signal representative of the rate of change of the output level;
   amplifying the converted signal; and
   comparing the converted signal to predetermined upper and lower limits and generating an out of lock output signal when the input exceeds the predetermined limits.

* * * * *